(12) United States Patent
Hamada et al.

(10) Patent No.: US 7,553,374 B2
(45) Date of Patent: Jun. 30, 2009

(54) COATING TREATMENT APPARATUS AND COATING TREATMENT METHOD

(75) Inventors: Masahito Hamada, Kumamoto (JP); Fumio Hirota, Kumamoto (JP); Shinji Kobayashi, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 751 days.

(21) Appl. No.: 11/047,600

(22) Filed: Feb. 2, 2005

(65) Prior Publication Data
US 2005/0181127 A1 Aug. 18, 2005

(30) Foreign Application Priority Data
Feb. 18, 2004 (JP) .............................. 2004-041797

(51) Int. Cl.
  B05C 11/06 (2006.01)
  B05C 11/00 (2006.01)
  B05C 11/02 (2006.01)
  B05C 11/10 (2006.01)
  B05B 7/06 (2006.01)
(52) U.S. Cl. .......................... 118/62; 118/64; 118/52; 118/56; 118/704; 118/504; 118/313
(58) Field of Classification Search ............ 118/52, 118/56, 57, 70, 313, 320, 321, 323, 665, 118/668, 679–681, 704, 706, 695, 58, 62–64, 118/326, 500, 501, 504; 427/240, 427.1, 427/427.2, 427.3; 396/604, 611, 627
See application file for complete search history.

(56) References Cited

U.S. PATENT DOCUMENTS

| 4,875,434 | A | * | 10/1989 | Maejima et al. | ................ 118/52 |
| 5,871,584 | A | * | 2/1999 | Tateyama et al. | ............ 118/323 |
| 6,383,948 | B1 | * | 5/2002 | Kitano et al. | ................ 438/758 |
| 6,398,868 | B1 | * | 6/2002 | Gordon et al. | ................ 118/52 |
| 6,527,860 | B1 | | 3/2003 | Yoshihara et al. | |
| 6,533,864 | B1 | | 3/2003 | Matsuyama et al. | |
| 7,048,800 | B2 | * | 5/2006 | Nguyen | ....................... 118/501 |

FOREIGN PATENT DOCUMENTS

JP         11-070354      3/1999

* cited by examiner

*Primary Examiner*—Yewebdar T Tadesse
(74) *Attorney, Agent, or Firm*—Smith, Gambrell & Russell, LLP (57) ABSTRACT

In the present invention, a gas flow restraining ring facing corner portions of the front face of a substrate horizontally held on a substrate holding unit and movable up and down, is set to a predetermined height in accordance with a coating treatment. Then, a coating solution containing a coating film forming component and a solvent is applied to the front face of the substrate and spread into a thin film state by a so-called spin coating method, and thereafter the substrate is rotated at a high speed so that the coating solution is dried. In this case, it is possible to control fresh gas flow from above the substrate to decrease the difference in evaporation rate of the solvent between the coating solution on the corner portions of the substrate and the coating solution inside them, thus enabling the coating treatment uniform within a plane on the substrate.

6 Claims, 12 Drawing Sheets

COATING TREATMENT APPARATUS AND COATING TREATMENT METHOD

BACKGROUND OF THE INVENTION

1. Field of the Invention

The present invention relates to a coating treatment apparatus and a coating treatment method each for applying, into a thin film state, a coating solution containing a coating film forming component and a solvent onto the front face of, for example, a square substrate such as a mask substrate.

2. Description of the Related Art

In a manufacturing process of a semiconductor device and an LCD, processing using a photolithography technique is performed. This processing is performed by a series of steps of applying a predetermined coating solution such as a resist, into a thin film state, onto the front face of, for example, substrates to be processed such as a semiconductor substrate and a mask substrate made of glass and drying it to form a film, and thereafter exposing the substrate to light and then performing developing treatment on the substrate to obtain a desired pattern.

Methods of forming, for example, a thin film of a resist on the front face of a square substrate being one of the aforementioned substrates to be processed, include a well-known method by spin coating. The spin coating will be briefly described using FIG. 13.

Figure 13:
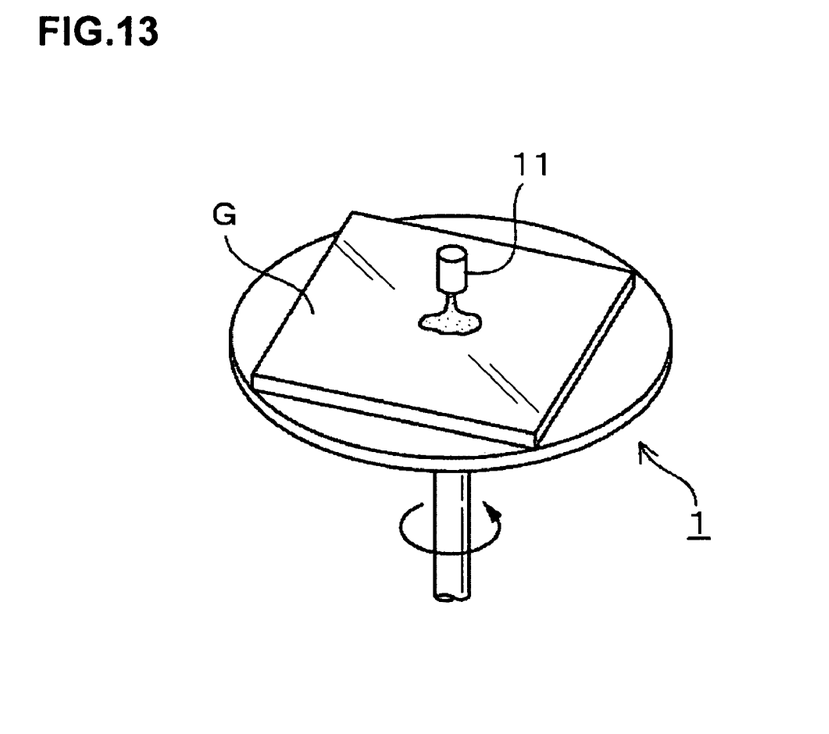
FIG. 13 is an explanatory view showing a conventional spin coating method.

In the drawing, a numeral 1 denotes a sp 1 in chuck for holding, in a horizontal posture, for example, a square substrate G such as a mask substrate, and a coating solution nozzle 11 is provided at a position slightly above the center portion of the front face of the substrate G on the spin chuck 1. Then, when the substrate G is rotated about the vertical axis by the spin chuck 1 and, for example, a coating solution (resist solution) made by mixing a resist component and a solvent such as a thinner is supplied onto the front face of the substrate G, the coating solution spreads over the entire front face of the substrate G by the effect of a centrifugal force, resulting in a solution film in a thin film state formed on the substrate G.

Subsequently, after the supply of the coating solution is stopped, a so-called spin drying is performed in which the substrate G is further rotated to allow the thinner to evaporate, whereby the resist component remains on the substrate G, thus forming a resist film. In the spin coating, as described above, the substrate G is rotated so that the coating solution is spread into a thin film state with an excessive coating solution spun off.

Figure 14:
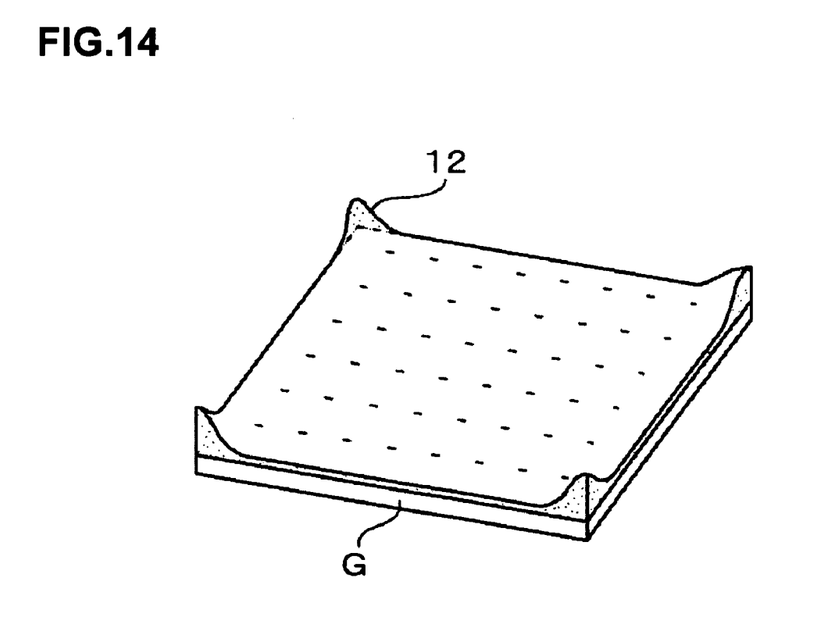
FIG. 14 is an explanatory view showing the appearance of a coating film formed by the conventional spin coating method.

Incidentally, when a coating film is formed on the front face of a square substrate using the spin coating method described above, there occurs a difference in circumferential speed between the center portion and the peripheral portion which are different in radius of gyration. Further, in a schematic description, there exists a swirl of solvent vapor evaporating from the coating solution within a circular region touching internally the substrate G during the spin coating, but a swirl above a passing region at corner portions lying off the circular region becomes a swirling flow with much fresh air taken-in because they are located outside the aforementioned swirl, so that the volatilization rate of the solvent at the corner potions is higher than that inside. As described above, if there is a difference in evaporation rate of the solvent between the corner portions and the center portion, a coating film 12 formed on the front face of the substrate has a shape specific to the square substrate in which the film thickness rises higher at the corner portions than at the center portion as schematically shown in FIG. 14. The coating film in such a shape is not usable in some cases because it affects exposure and development, leading to a decrease in yield of substrate.

Figure 15:
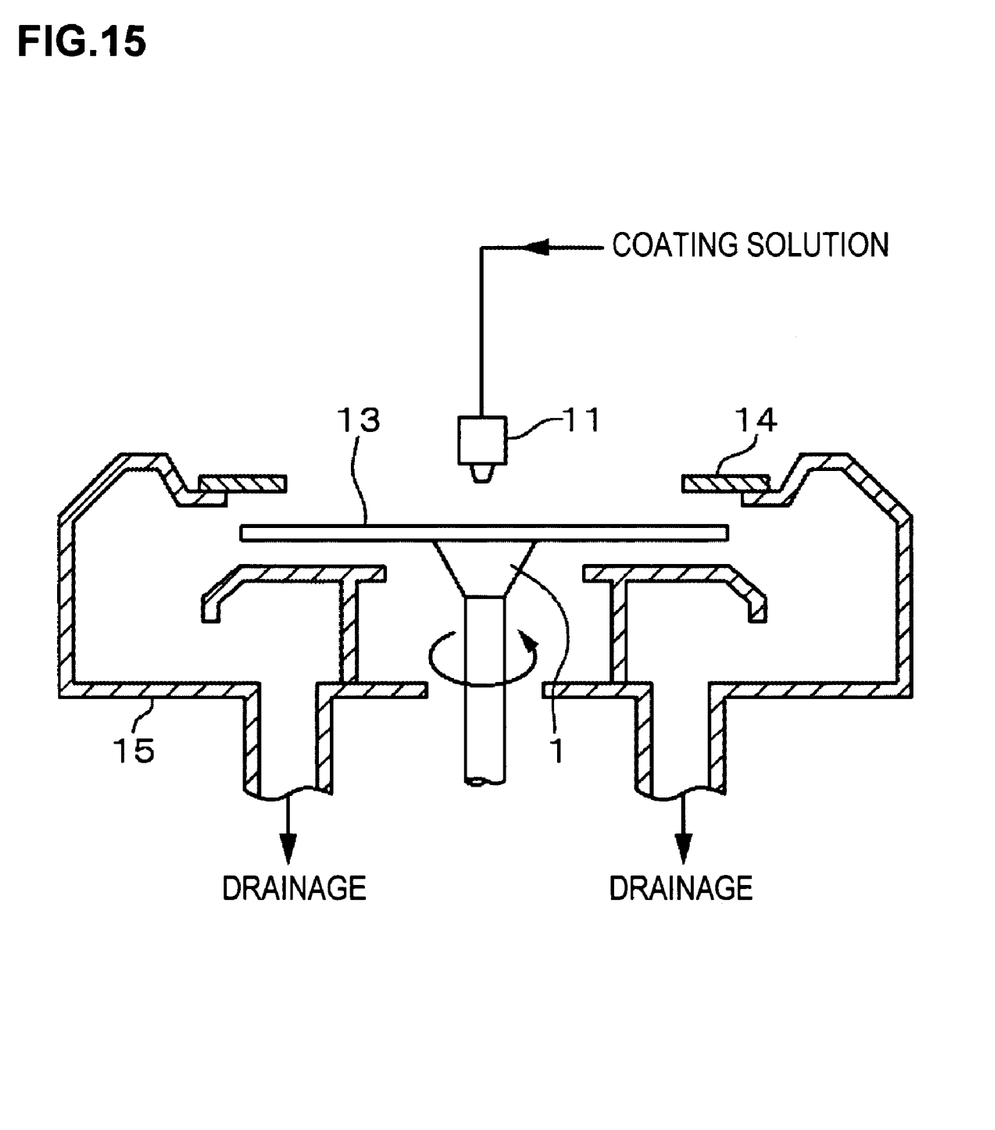
FIG. 15 is an explanatory view showing another example of the conventional spin coating method.

One of measures to this problem has been reported, for example, as shown in FIG. 15, in which a gas flow restraining ring 14 is provided on an inner periphery of a cup 15 surrounding the substrate G in a manner to face the front face at the corner portions of the substrate G, whereby the evaporation rate of the solvent at the corner portions of the substrate G is restrained to uniformize the film thickness (for example, in a first embodiment of Japanese Patent Application Laid-open No. Hei 11-70354, FIG. 2).

In such a conventional technique, since the cup 15 is being exhausted and the substrate G is being rotated, a gas flow (downflow) from above the cup 15 toward the front face of the substrate G is formed, in which a gas flow restraining ring 14 is provided to restrict to inside the corner portions of the substrate G the region against which the downflow hits, thereby increasing the concentration of the solvent vapor of the swirling flow within the passing region at the corner portions so as to suppress the evaporation of the solvent at the corner portions to decrease the rise of the film.

SUMMARY OF THE INVENTION

However, there has been a problem as follows. The problem is that the inside diameter of the gas flow restraining ring sensitively affects the film thickness profile of the coating film such that the way of the film rising up at the corner portions changes due to, for example, a change of only 1 mm in the inside diameter of the gas flow restraining ring, and therefore when the coating condition such as the kind of coating solution, a target value of a film thickness, a region on the substrate where a predetermined in-plane uniformity needs to be secured, or the like is changed, a gas flow restraining ring having an appropriate inside diameter needs to be prepared in accordance with the change.

In recent years, manufacture of the mask substrate by coating and development is shifting from the conventional production model of fewer varieties and higher volume to the production model of more varieties and lower volume. If a gas flow restraining ring with an appropriate inside diameter is prepared for each kind of product so that the gas flow restraining ring is changed in accordance with the kind of product in a common unit, that changing work may require much effort. Further, if a dedicated coating unit is prepared for each kind of product, it may increase the number of units and make the process steps complicated.

Further, when a further decrease in the film thickness is desired in the future, the rotation speed of the substrate needs to be made higher than at present. However, if the rotation speed is increased, the difference in speed between the corner portions and the inner region becomes large and the difference in drying rate of the solvent accordingly increases, and as a result, there is a fear that the difference in the film thickness of the coating film is further increased between the corner portions and the inner region of the substrate. As described above, when the difference in the evaporation speed is made too large between the corner portions and the inner region, there may be a limit to measures against that only by changing the inside diameter of the gas flow restraining ring.

The present invention has been developed in consideration of the above circumstances, and its object is to secure in-plane uniformity of the film thickness in forming a coating film by applying a predetermined coating solution onto the front face of a square substrate.

To achieve the above object, the present invention is a coating treatment apparatus for applying a coating solution containing a coating film forming component and a solvent to a front face of a square substrate and rotating the substrate about a vertical axis to spread the coating solution into a thin film state over the front face of the substrate, including: a substrate holding unit for horizontally holding the substrate; a rotating mechanism for rotating the substrate on the substrate holding unit about the vertical axis; a coating solution nozzle for supplying the coating solution to the front face of the substrate; a gas flow restraining ring provided facing the front face at corner portions of the substrate held on the substrate holding unit, for restraining a gas flow above the substrate; and a raising and lowering mechanism for raising and lowering the gas flow restraining ring.

The coating treatment apparatus of the present invention may further include a cup provided to surround the substrate holding unit and an exhaust path for exhausting an atmosphere in the cup, wherein the gas flow restraining ring is provided along an inner periphery of the cup. The coating treatment apparatus may further include a control unit for storing data for changing the height of the gas flow restraining ring in accordance with the rotation speed of the substrate and controlling based on the data the height of the gas flow restraining ring.

The coating treatment apparatus may further include a control unit for storing data in which the height of the gas flow restraining ring is associated with at least one of the kind of coating solution, a target film thickness of a coating film, or a target area of the front face of the substrate where an in-plane uniformity is attained at a predetermined value or more in terms of the film thickness, and controlling based on the data the height of the gas flow restraining ring.

The coating treatment apparatus may further include a supporting member raised and lowered by the raising and lowering mechanism, wherein the gas flow restraining ring is freely attachably and detachably provided on the supporting member, and wherein the gas flow restraining ring is replaceable with another gas flow restraining ring different in inside diameter.

The coating treatment apparatus may, further include a solvent supply unit for supplying a solvent as a vapor or a mist to a gas flow formed above the front face of the substrate, and in this case, the solvent supply unit may be configured to have a solvent flow passage provided in the gas flow restraining ring and a solvent supply port opening in a lower face of the gas flow restraining ring.

According to another aspect of the present invention, the present invention is a coating treatment method of applying a coating solution to a front face of a square substrate, including the steps of: horizontally holding the square substrate by a substrate holding unit and placing a gas flow restraining ring to face the front face at corner portions of the substrate; relatively raising and lowering the substrate holding unit and the gas flow restraining ring by a raising and lowering mechanism to set the gas flow restraining ring at a height position in accordance with a coating treatment; and supplying the coating solution containing a coating film forming component and a solvent to the front face of the substrate and rotating the substrate holding unit about a vertical axis to spread the coating solution over the front face of the substrate with a gas flow above the substrate being restrained by the gas flow restraining ring.

The gas flow restraining ring may be provided along an inner periphery of a cup provided to surround the substrate holding unit, and an atmosphere in the cup may be being exhausted when the substrate holding unit is being rotated.

Further, it is also suitable to change the height of the gas flow restraining ring during a coating treatment of the substrate. In this case, for example, the height of the gas flow restraining ring may be changed in accordance with the rotation speed of the substrate.

The coating treatment method may further include the steps of: loading from a storage unit data in which the height of the gas flow restraining ring is associated with at least one of the kind of coating solution, a target film thickness of a coating film, and a target area of the front face of the substrate where an in-plane uniformity is attained at a predetermined value or more in terms of the film thickness; and controlling based on the data the height of the gas flow restraining ring.

A solvent may be supplied as a vapor or a mist to a gas flow formed above the front face of the substrate. In this case, the solvent may be supplied from a solvent supply port opening in a lower face of the gas flow restraining ring.

According to the present invention, the gas flow restraining ring is provided to freely rise and lower, so that, for example, even when substrates with different coating conditions are treated, the gas flow hits against the front face at the corner portions of the substrate can be controlled by appropriately setting the height position of the gas flow restraining ring. This suppresses the evaporation rate of the coating solution applied on the front face at the corner portions of the substrate to thereby enable the evaporation rate of the solvent to be uniform within the plane of the substrate. Therefore, it can be restrained that the coating solution existing on the surface at the corner portions of the substrate dries faster and becomes thicker than that existing inside them, and as a result a coating film uniform within the plane can be formed on the front face of the substrate. Accordingly, it is unnecessary to replace the gas flow restraining ring with another.

DETAILED DESCRIPTION OF THE INVENTION

A coating treatment apparatus according to an embodiment of the present invention will be described with reference to FIG. 1 and FIG. 2. In the drawings, a numeral 2 denotes a spin chuck for horizontally holding a square substrate G, for example, a mask substrate. The spin chuck 2 is provided with a planar portion 21, surrounding the outside of the periphery of the held substrate G such that its outer periphery forms an almost circle looking from above, in such a manner to align in height with, for example, the front face of the substrate G. The spin chuck 2 is connected via a shaft portion 23 with a drive mechanism 22 provided thereunder and configured to freely rotate about the vertical axis and freely rise and lower while holding the substrate G, by means of the drive mechanism 22. Further, the mask substrate is, for example, a glass substrate having a size, for example, 152±0.4 mm in length of a side and 6.35±0.1 mm in thickness.

The front face of the spin chuck 2 is formed with through holes, for example, at three points, and substrate supporting pins 24 are provided to freely project and retract which support the substrate G on the rear face side via the through holes. The substrate supporting pins 24 are ascendable and descendable by means of a raising and lowering unit 25 and configured such that the substrate G is delivered to the spin chuck 2 by cooperative action between a not-shown substrate carrier arm and the substrate supporting pins 24.

A cylindrical cup body 3 is provided in a manner to surround the periphery of the substrate G on the spin chuck 2 set at a lowered position. On the upper side, the cup body 3a is provided with, for example, a circular opening region 31 which allows a gas flow to be introduced from above, for example, when the cup body 3 is exhausted. The opening region 31 forms a carry-in/out port through which the substrate G is carried in/out in a state in which a later-described gas flow restraining ring 4 is set at a raised position. On the lower side, the cup body 3 is formed with, for example, an annular solution receiving portion 32 below the periphery of the substrate G. The solution receiving portion 32 is partitioned into an inner region and an outer region by a vertical partition wall 33, in which a drain port 34 for draining drainage is provided in the outer region and an exhaust port 35 is provided in the inner region.

Inside the cup body 3, a first inner cup 36 and a second inner cup 37, which are inclined downward and to the outside, are provided one on the other with a gap therebetween, so that the gap between the first inner cup 36 and the second inner cup 37 forms a flow path through which the coating solution spilt over from the substrate G flows. A gap between the first inner cup 36 and a ceiling face of the cup body 3 forms a flow path through which an exhaust flow flows. To the exhaust port 35, an exhaust unit 39 for exhausting the cup body 3 is connected via an exhaust path 38, for example, a pipe.

On the upper side of the substrate G on the spin chuck 2, the gas flow restraining ring 4, which is a gas flow restraining member for receiving a portion of a gas flow from above passing through the opening region 31 and restraining the flow, is provided to freely rise and lower. The gas flow from above is a gas flow which is created by exhausting the cup body 3 and rotating the substrate G about the vertical axis and made of air controlled in temperature and humidity flowing from above toward the front face of the substrate G.

The size of the inside diameter of the gas flow restraining ring 4 is set so that it faces the front face at corner portions of the substrate G, that is, a projection region of the gas flow restraining ring 4 covers the corner portions of the substrate G. For example, as for the already described mask substrate, the diameter is set to fall within a range, for example, from φ150 mm to φ170 mm. The gas flow restraining ring 4 is formed, on its lower face side, with a flat lower surface extending horizontally and is formed, on its outer periphery, with a vertical end face portion 41 extending downward in a ring shape along the inner edge (open edge) of the upper face of the cup body 3. The gap between the end face portion 41 and the open edge of the cup body 3 is a narrow gap which prevents disturbance of a gas flow around the peripheral portion of the substrate G caused by air flowing in through the gap and never interferes with rising and lowering.

On the other hand, the gas flow restraining ring 4 is formed, on its upper face side, in the shape of, for example, steps which become higher outward. On the upper side of the outer peripheral face of the gas flow restraining ring 4, a supporting member 42 for supporting the gas flow restraining ring 4 is provided, for example, in a freely attachable and detachable manner. Further, the supporting member 42 is connected to a raising and lowering mechanism 44 via a shaft portion 43. The gas flow restraining ring 4 is configured to be adjustable in height position so that a separation distance L between the rear face of the gas flow restraining ring 4 and the front face of the substrate G falls within a range from 7.5 mm to 27.5 mm by means of the raising and lowering mechanism 44.

The length of the end face portion 41 is set so that when the gas flow restraining ring 4 is set at the highest position in the above-described range, its tip is located at a position lower than the upper face of the cup body 3. This structure is advantageous since air can be prevented from flowing through a large gap created between the outer peripheral face of the gas flow restraining ring 4 and the cup body 3 caused by raising the gas flow restraining ring 4 and since the range of the set value of the height of the gas flow restraining ring 4 can be made large by the length of the end face portion 41.

A coating solution nozzle 5, having a discharge hole 50, for example, having a small diameter, is provided to freely rise and lower and move back and forth, facing the center portion of the front face of the substrate G. A supply passage 51 is connected, on one end side, to the coating solution nozzle 5 and further connected, on the other end side, to a coating solution supply source 52, and a not-shown flow rate regulating unit is provided along the supply passage 51. The coating solution nozzle 5 is freely detachably supported by a nozzle arm 53, and a moving base 54 is provided on the base end side of the nozzle arm 53 as shown in FIG. 2.

The moving base 54 is laterally movable along a guide rail 55. In FIG. 2, a numeral 56 denotes a housing section for housing the coating solution nozzle 5. In the housing section 56, a plurality of coating solution nozzles 5 are housed, though illustration thereof is omitted, and connected to coating solution supply sources 52 capable of supplying coating solutions different in kind from each other via independent supply passages 51 respectively. Accordingly, various kinds of coating solutions can be applied onto the front face of the substrate G, for example, by taking out, from the housing section 56 by the nozzle arm 53, a coating solution nozzle 5 capable of discharging a predetermined kind of coating solution based on the process condition, guiding it to a position where it faces the front face of the substrate G, and supplying the coating solution from the coating solution nozzle 5 to the substrate G. Note that it is not always necessary to provide the plurality of coating solution nozzles 5, but it is also suitable to connect, for example, coating solution supply sources 52 different in kind from each other to a common coating solution nozzle 5 via the supply passages 51 so that a predetermined kind of coating solution can be supplied using, for example, a switching means such as a not-shown valve.

Figure 1:
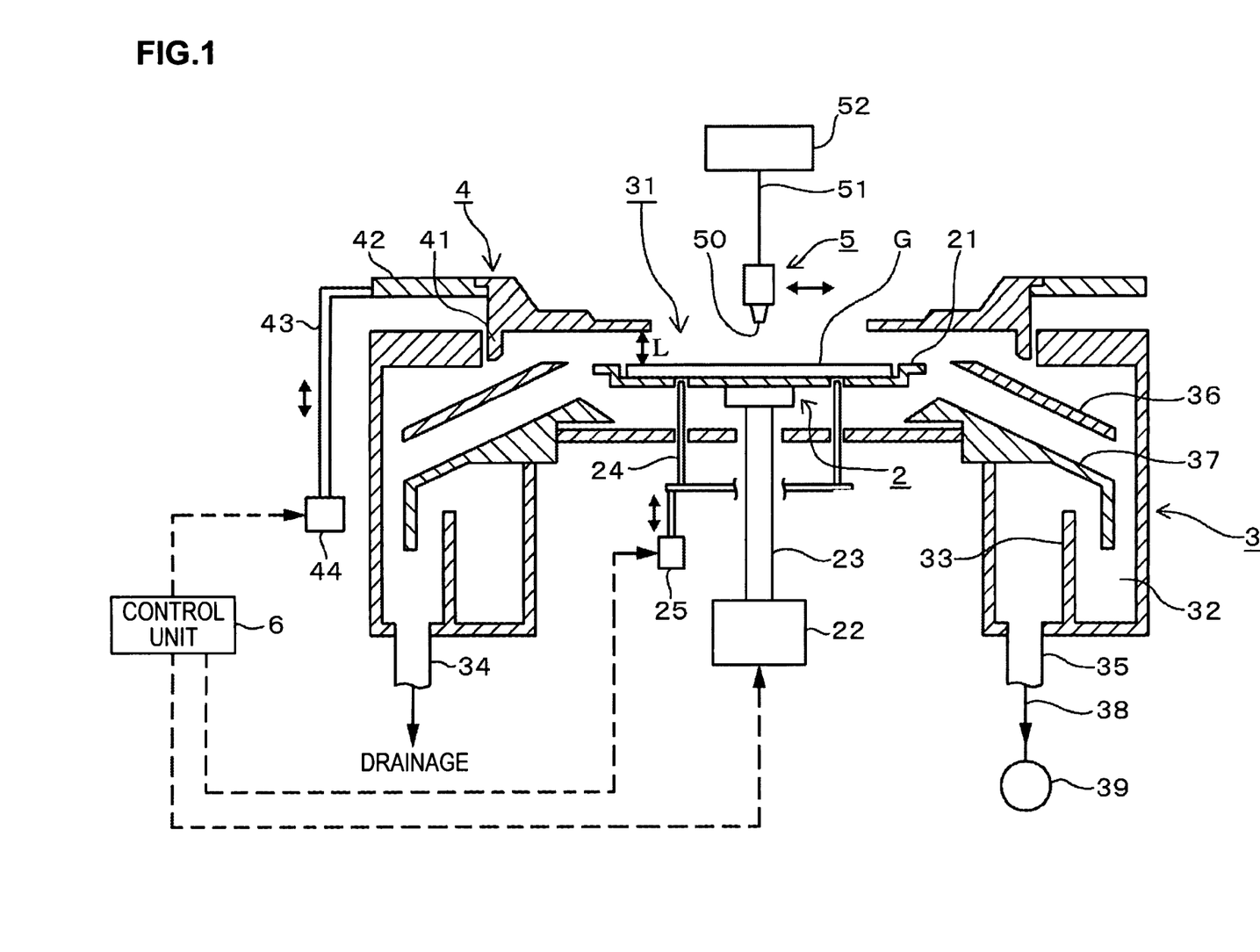
FIG. 1 is a longitudinal sectional view showing a coating treatment apparatus according to an embodiment of the present invention.
Figure 2:
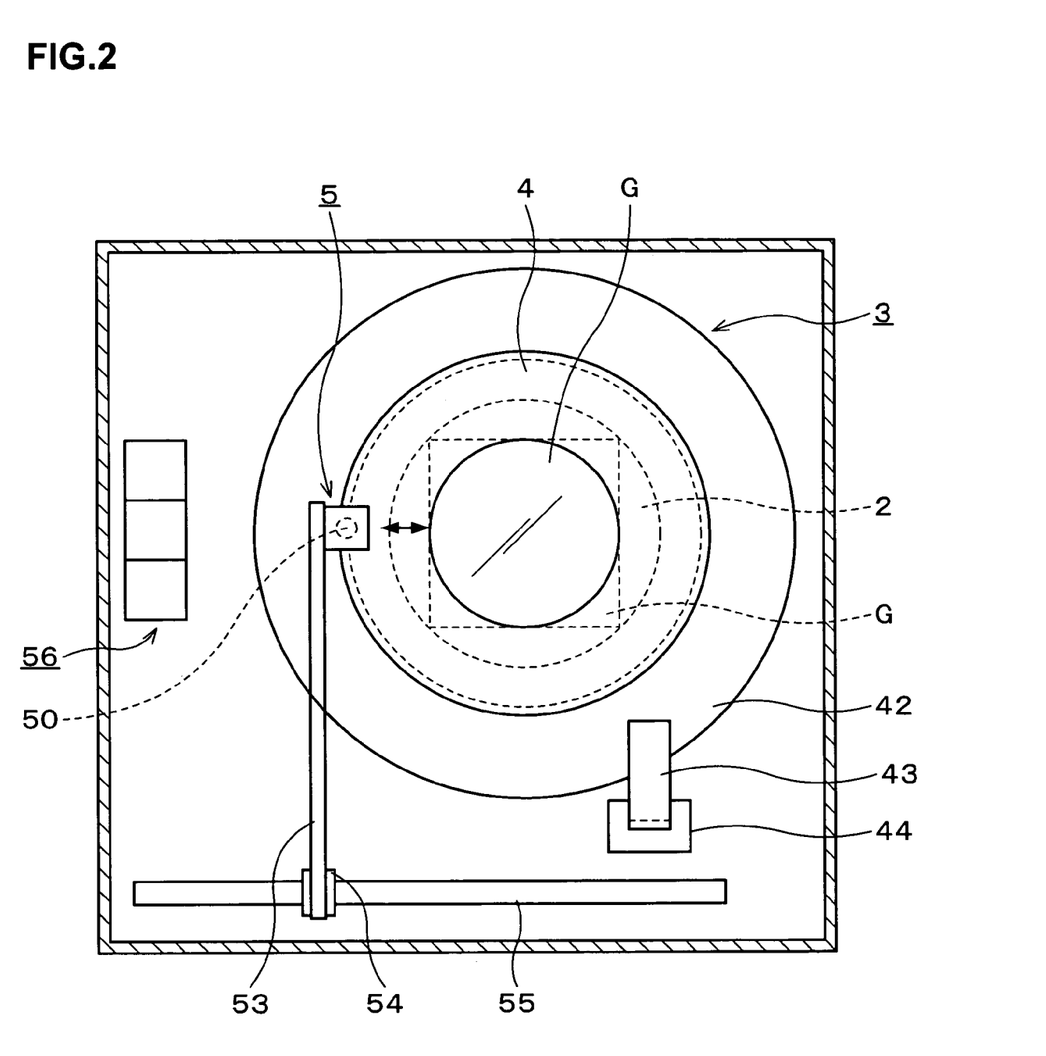
FIG. 2 is a plan view showing the coating treatment apparatus according to the embodiment of the present invention.

Besides, in FIG. 1, a numeral 6 denotes a control unit which has a function of controlling the operations of the drive mechanism 22, raising and lowering mechanism 44, and raising and lowering unit 25. The control unit 6 further has a control function of setting the gas flow restraining ring 4 to a predetermined height position based on the coating condition.

Figure 3:
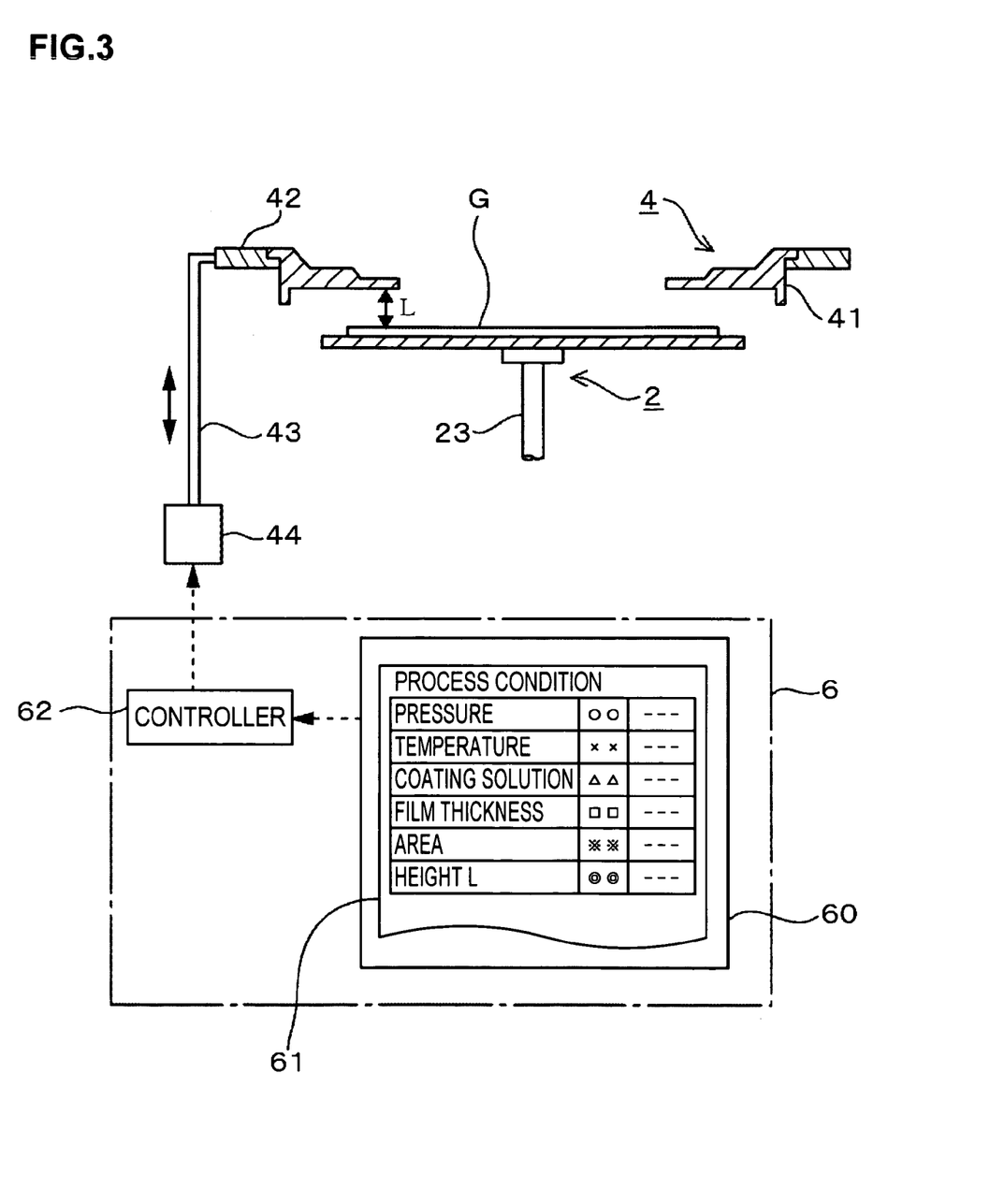
FIG. 3 is an explanatory view for explaining a control system of the coating treatment apparatus in FIG. 1.

This control function will be described in detail using FIG. 3. For example, a computer 60 retained by the control unit 6 includes, for example, a storage unit such as a memory for storing a process recipe 61 in which set values of various process conditions are set. Stored in the process recipe 61 are set values of the separation distance L between the gas flow restraining ring 4 and the substrate G, which is the height of the gas flow restraining ring 4 from the front face of the substrate G, associated with various set values of the kind of coating solution, especially on the viscosity and the vapor pressure of the solvent contained in the coating solution, the target film thickness being objective film thickness of the coating film, the target area which will be described later in detail, and the rotation speed of the substrate G during the coating treatment.

In other words, the control unit 6 has the storage unit for storing data on the set value of the height of the gas flow restraining ring 4 associated with the coating conditions and the function of controlling based on the data the height of the gas flow restraining ring 4, and is configured to load from the storage unit the set value of the height position of the gas flow restraining ring 4 based on the data on the set values of the kind of coating solution, the target film thickness, the target area, and the rotation speed of the substrate G so that a controller 62 controls the operation of the raising and lowering mechanism 44 based on the set values to set the gas flow restraining ring 4 to a predetermined height position.

Note that it is not always necessary that the control unit 6 stores the data on the set values of the height of the gas flow restraining ring 4 associated with the coating conditions, but, for example, an operator may input as necessary the set value of the height of the gas flow restraining ring 4 based on the coating condition.

Figure 4:
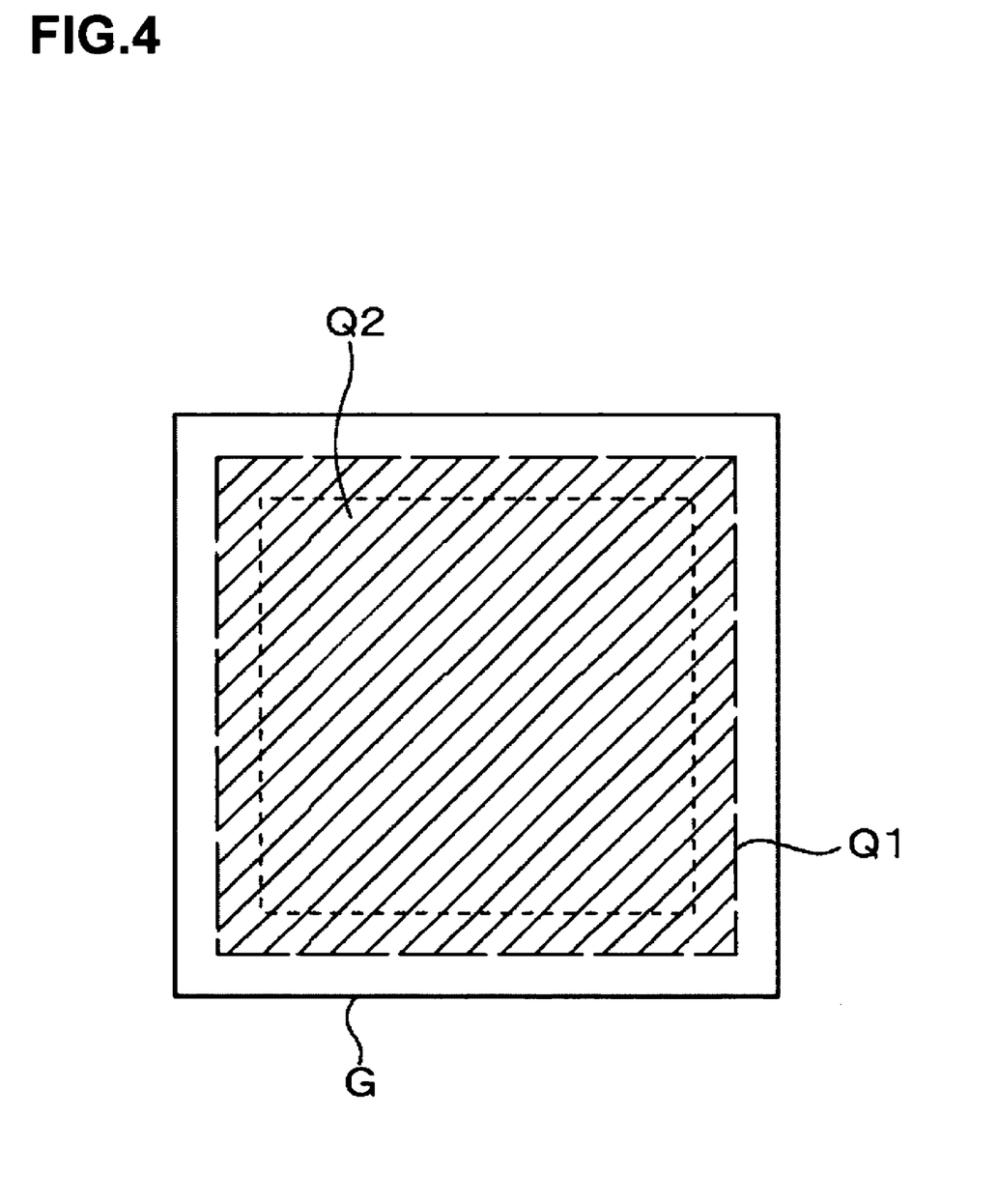
FIG. 4 is an explanatory view showing a target area coated by the coating treatment apparatus in FIG. 1.

The aforementioned target area will be described here in detail. To improve the yield of the substrate G, it is advantageous to uniformize the film thickness close to the outer periphery including the corner portions. However, the region where the in-plane uniformity at a predetermined value or more is desired to be satisfied within the plane of the substrate G may differ even for the same kind of substrates G depending on, for example, aligners. In other words, the regions where a coating film is demanded to be formed at a predetermined accuracy may differ in size and position. In the present invention, the region where the in-plane uniformity at a predetermined value or more is satisfied shall be called a target area. When the substrate G is used, for example, for a photomask for providing a developed line width of 100 nm or less, there are examples of the target area, as shown in FIG. 4, including a case of a demand for formation of a film thickness at an accuracy of, for example, 1.5% or less within a region Q1 in a square with an inner side of 140 mm and a case of a demand for formation of a film thickness at an accuracy of, for example, 1.0% or less within a region Q2 in a square with an inner side of 130 mm. Note that the target areas are shown smaller than their actual sizes for convenience of illustration.

Further, setting of the height of the gas flow restraining ring 4 to the aforementioned coating conditions will be described taking examples. In a case in which, for example, the coating solutions are different in viscosity, when the viscosity is high, the gas flow restraining ring 4 is set to a lower position, for example, with a separation distance L of 7.5 mm to 17.5 mm, and contrary to that when the viscosity is low, the gas flow restraining ring 4 is set to a higher position, for example, with a separation distance L of 17.5 mm to 27.5 mm. In a case in which, for example, the coating solutions are different in volatility of solvent, that is, when the vapor pressure of solvent is high, the gas flow restraining ring 4 is set to a lower position, for example, with a separation distance L of 7.5 mm to 17.5 mm, and contrary to that when the vapor pressure of solvent is low, the gas flow restraining ring 4 is set to a higher position, for example, with a separation distance L of 17.5 mm to 27.5 mm. In a case in which, for example, the target film thicknesses are different, when the target film thickness is large, the gas flow restraining ring 4 is set to a higher position, for example, with a separation distance L of 17.5 mm to 27.5 mm, and contrary to that when the target film thickness is small, the gas flow restraining ring 4 is set to a lower position, for example, with a separation distance L of 7.5 mm to 17.5 mm. In a case in which, for example, the target areas are different, when the target area is large, the gas flow restraining ring 4 is set to a higher position, for example, with a separation distance L of 17.5 mm to 27.5 mm, and contrary to that when the target area is small, the gas flow restraining ring 4 is set to a lower position, for example, with a separation distance L of 7.5 mm to 17.5 mm. Further, in a case in which, for example, the rotation speeds of the substrates G are different, when the rotation speed is low, the gas flow restraining ring 4 is set to a higher position, for example, with a separation distance L of 17.5 mm to 27.5 mm, and contrary to that when the rotation speed is high, the gas flow restraining ring 4 is set to a lower position, for example, with a separation distance L of 7.5 mm to 17.5 mm. Note that these are only examples, and therefore how the setting is made is preferably decided by performing experiments in advance.

Subsequently a step of applying the coating solution, for example, a resist to the front face of the substrate G will be described using the above-described coating treatment apparatus. First, in a state in which the gas flow restraining ring 4 is set at an upper position, the coating solution nozzle 5 is waiting outside the cup body 3, and the exhaust unit 39 is exhausting the cup body 3, a not-shown substrate carrier arm laterally enters a space between the upper face of the cup body 3 and the rear face of the gas flow restraining ring 4 to guide the substrate G to a position above the opening region 31 of the cup body 3. Then, the substrate supporting pins 24 are raised to receive the substrate G from the substrate carrier arm and lowered to deliver the substrate G to the spin chuck 2, while the substrate carrier arm retracts. Further, the gas flow restraining ring 4 is lowered and set at a height position in accordance with the coating condition of the coating treatment loaded in the control unit 6 and implemented from now.

Subsequently, the nozzle arm 53 takes out of the waiting portion 56 the coating solution nozzle 5 capable of discharging an expected kind of resist and guides the coating solution nozzle 5 to a position slightly above the center portion of the front face of the substrate G. Thereafter, the spin chuck 2 is rotated to rotate the substrate G, for example, for a few seconds at a high speed, at a first circumferential speed of, for example, 2500 rpm, and a coating step is performed in which the resist is discharged, for example, for 1.5 seconds from the discharge port 50 of the coating solution nozzle 5 toward the center portion of the substrate G. The resist supplied to the front face of the substrate G in this event spreads toward the periphery side by the effect of a centrifugal force of the rotated substrate G, and an excessive resist on the substrate G is spun off. Note that it is also suitable to rotate the substrate G after the resist is applied to the substrate G. For example, after a lapse of 2.0 seconds after completion of the discharge of the resist, a spin drying step is performed in which the substrate G is rotated, for example, for 15 seconds to 30 seconds at a second circumferential speed of, for example, 100 rpm. Evaporation of a thinner contained in the resist solution on the front face of the substrate G is accelerated, and then the residual resist component forms a resist film having a thickness of about 0.5 µm on the front face of the substrate G. Thereafter, the gas flow restraining ring 4 is raised to a waiting position, and then the not-shown substrate carrier arm receives the substrate G lifted upward to the upper position by the substrate supporting pins 24, and carries it out of the coating treatment apparatus.

Figure 5A:
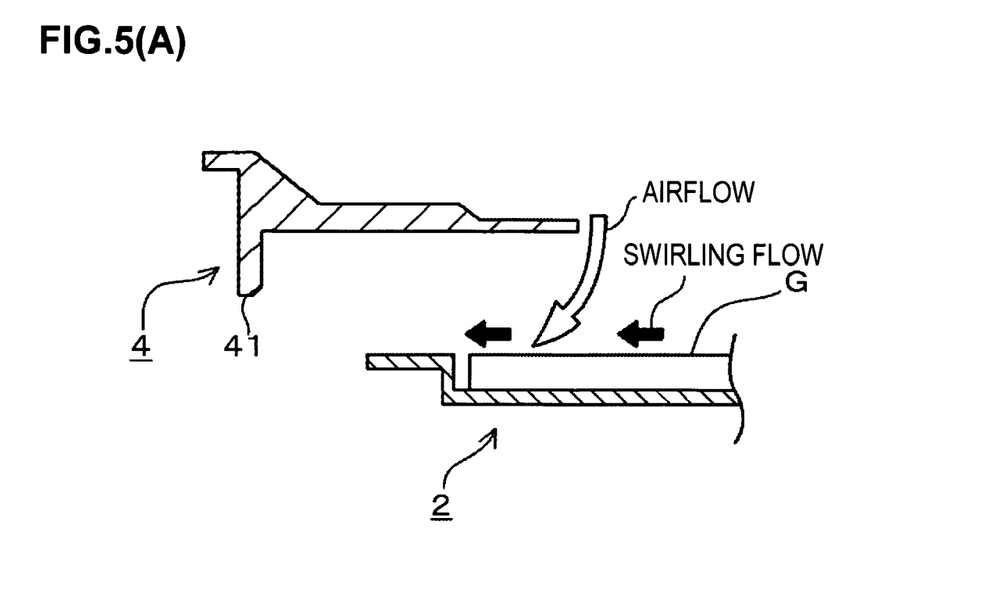
FIGS. 5A and 5B are explanatory views showing the appearance of a gas flow flowing above the front face of a substrate coated by the coating treatment apparatus in FIG. 1, FIG. 5A showing the appearance of the side and FIG. 5B showing the appearance of the plane.
Figure 5B:
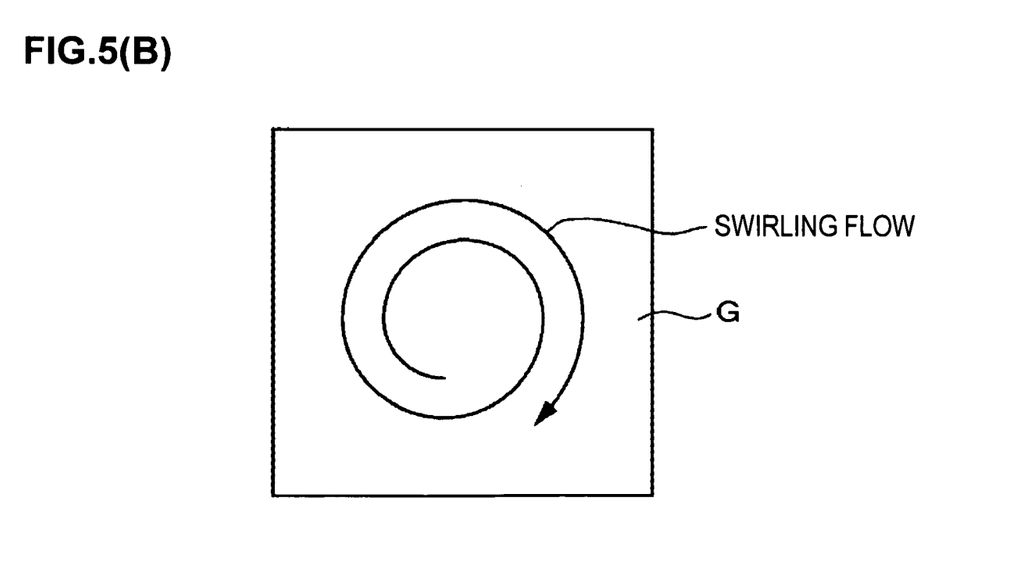

The flow of a gas flow formed when the substrate G is rotated about the vertical axis will be described here in-detail using FIGS. 5A and 5B. The solvent component evaporated from the resist existing on the front face of the substrate G forms a gas flow of the solvent vapor flowing outward in a swirling form along the front face, in terms of rotation system, since the substrate G is rotated. On the other hand, the cup body 3 is being exhausted from under the substrate G and the substrate G is being rotated, and therefore a gas flow (downflow) flowing from above the opening region 31 of the cup body 3 toward the front face of the substrate G, for example, a gas flow made of, for example, air controlled in temperature and humidity is formed. Hereinafter, the gas flow shall be called "airflow" for convenience of illustration, and this gas flow is not limited to that made of air, as long as it is made of a gas having a low solvent concentration. A portion of the airflow from above, flowing to a position corresponding to the corner portions of the substrate G is received by the gas flow restraining ring 4 and restrained from entering the cup body 3, while airflow passing through the inside diameter region within the gas flow restraining ring 4 shifts to the lateral direction near the front face of the substrate G and taken into the aforementioned swirling flow of solvent vapor and exhausted through the peripheral portion of the substrate G to the lower side.

Figure 6A:
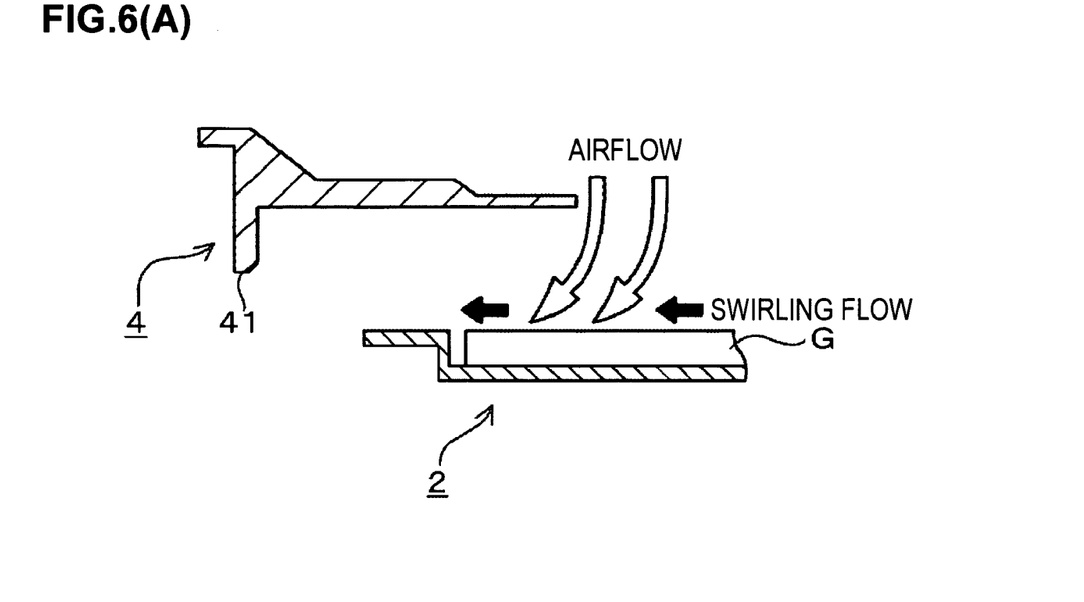
FIGS. 6A and 6B are explanatory views showing from the side the appearance of a gas flow flowing above the front face of the substrate coated by the coating treatment apparatus in FIG. 1, FIG. 6A showing the appearance when a gas flow restraining ring is at a high position and FIG. 6B showing the appearance when the gas flow restraining ring is at a low position.

When the gas flow restraining ring 4 is set at a high position, the airflow passing through the gas flow restraining ring 4 spreads outward by the time it reaches the front face of the substrate G since the distance to the substrate G is large, as schematically shown in FIG. 6A, and therefore the region of the front face of the substrate G against which the airflow hits is large (the position against which the airflow hits is closer to the corner portions of the substrate G). Accordingly, the swirling flow of solvent vapor takes in a large amount of air, so that the swirling flow of solvent vapor passing above the corner portions of the substrate G is low in solvent concentration.

Figure 6B:
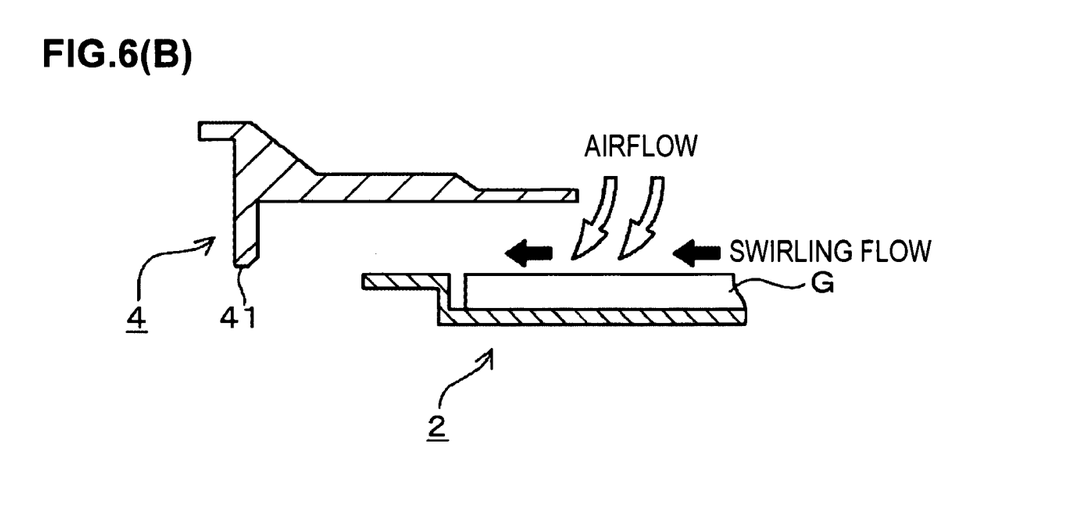

In contrast to the above, when the gas flow restraining ring 4 is set at a low position, the airflow passing through the gas flow restraining ring 4 hardly spreads outward and straight reaches the front face of the substrate G, as schematically shown in FIG. 6B, and therefore the region of the front face of the substrate G against which the airflow hits is small (the position against which the airflow hits is away from the corner portions of the substrate G). Accordingly, the swirling flow of solvent vapor takes in a small amount of air as compared with the above case in which the gas flow restraining ring 4 is set at a high position, so that the swirling flow passing above the corner portions of the substrate G is high in solvent concentration.

According to the above-described embodiment, the gas flow restraining ring 4 is provided to freely rise and lower. Therefore, even when the substrates G are treated which are different in coating conditions, for example, the kind of coating solution, the target film thickness, the target area, and the rotation speed of the substrate G, the gas flow restraining ring 4 is set at an appropriate height position for each substrate G to control the region of the front face of the substrate G against which the airflow hits from above, whereby the solvent component concentration of the atmosphere above and near the front face at the corner portions can be adjusted to suppress the evaporation rate of the resist on the front face at the corner portions to thereby reduce the difference between the evaporation above rate and the evaporation rate of the resist within a region inside the corner portions. This decreases variations in the evaporation rate of the solvent within the plane of the substrate G, reducing the possibility in which the resist existing on the front face at the corner portions of the substrate G dries faster and becomes larger in thickness than the resist existing inside the corner portions. As a result, a resist film with a high in-plane uniformity can be formed on the front face of the substrate G.

In other words, it can be realized to obtain the same effect, as in the case where the inside diameter of the gas flow restraining ring 4 is adjusted, by adjusting the height of the gas flow restraining ring 4, and it is possible to perform the coating treatment with a high accuracy on the substrates G different in coating condition by using a common gas flow restraining ring 4 with a certain inside diameter set. This eliminates the necessity to replace gas flow restraining ring 4 with another when the coating condition is changed, for example, at the time when lots are changed, resulting in improved throughput. Further, to cope with a larger number of products, it is also suitable to prepare several gas flow restraining rings 4 with certain inside diameters set different from each other and replace the gas flow restraining rings 4 with each other. Even in such a case, the number of gas flow restraining rings 4 and the frequency of replacement can be reduced owing to the gas flow restraining rings 4 configured to rise and lower. Furthermore, the downflow hitting against the substrate G may be adjusted by a combination of the inside diameter and the height position of the gas flow restraining ring 4, in which case the gas flow can be adjusted more finely, so that the in-plane uniformity of the film thickness on the substrate G can be further improved.

Note that the gas flow restraining ring 4 is not limited to a configuration in which its height is set in association with the kind of coating solution, the target film thickness, the target area, and the rotation speed of the substrate G, which are coating conditions, but the set value of the gas flow restraining ring 4 may be decided in association with one of them.

In the present invention, the time when the height of the gas flow restraining ring 4 is set to the predetermined height is not limited to before supply of the coating solution onto the substrate G, but the gas flow restraining ring 4 may be set to a predetermined height position in accordance with, for example, the timing of completion of the coating (start of the spin drying). Also in this case, the effects similar to those in the above-described case can be obtained. Further, during the coating, for example, when the coating solution is being spread over the front face of the substrate G, or when the spin drying is being performed before evaporation of the solvent is completed, the gas flow restraining ring 4 may be set to the predetermined height during the step.

Further, it is also suitable to decide in advance a plurality of set values different in height from each other and change the set value of the height of the gas flow restraining ring 4 at some midpoint. Specifically, it is suitable to prepare a set value of the height, for example, for each step such that the gas flow restraining ring 4 is set to a first height when the coating solution is being spread over the front face of the substrate G and it is set to a second height when the spin drying is being performed.

When the height of the gas flow restraining ring 4 is changed during the coating treatment, it may be set in accordance with the rotation speed of the substrate G (that is the number of rotations per unit time of the substrate G) such that, for example, when applied to the above-described embodiment, the gas flow restraining ring 4 is set to the first height when the substrate G is being rotated at 2500 rpm and it is set to the second height higher than the first height when the number of rotations is decreased to 100 rpm. In this case, the timing of change of the height of the gas flow restraining ring 4 may be decided based on the detection result of the number rotations, and may be managed in terms of time. Also in this configuration, the effects similar to those in the above-described case can be obtained, in which the gas flow restraining ring 4 is set to an appropriate height for each step, whereby it can be expected that the coating treatment uniform within the plane is performed more surely.

Furthermore, the height of the gas flow restraining ring 4 may be changed during the coating step or the spin drying. Specifically, it is suitable to set in advance a first height when the concentration of the solvent contained in the coating solution is high and a second height at a certain concentration lower than the above concentration, for example, during performance of the spin drying, so that the gas flow restraining ring 4 is first set to the first height so that the spin drying is performed, and changed in height to the second height higher than the first height when the solvent concentration is lowered to the aforementioned certain concentration due to advance of evaporation after a lapse of a predetermined period. Also in this case, the effects similar to those in the above-described case can be obtained.

Figure 7:
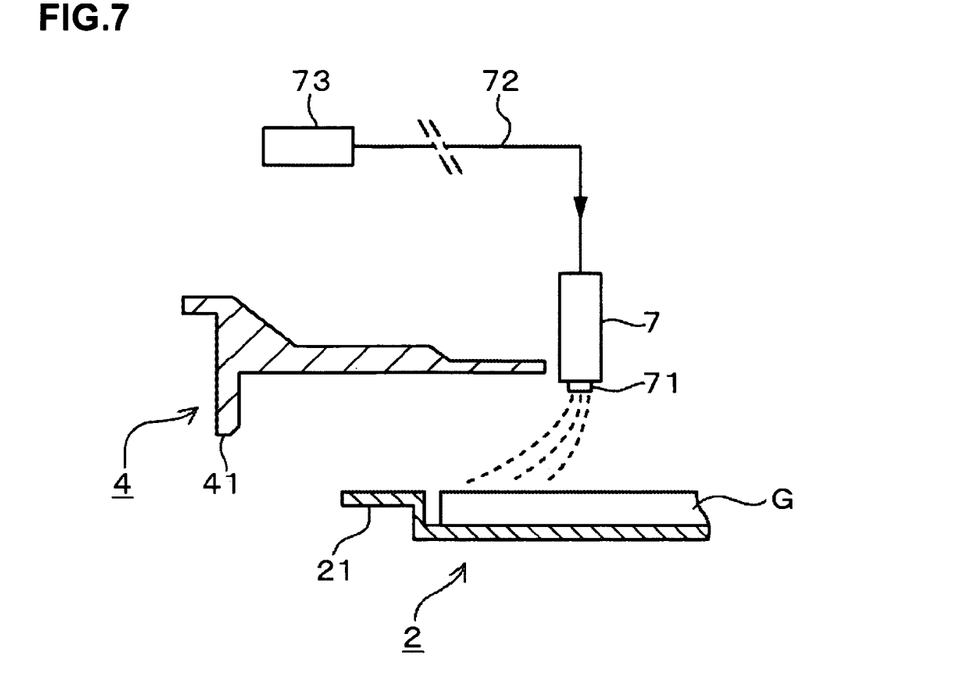
FIG. 7 shows another example of the gas flow restraining ring provided in the coating treatment apparatus in FIG. 1.

In the present invention, it is also suitable that a solvent component supply unit for supplying a solvent component to a gas flow flowing into the space between the gas flow restraining ring 4 and the front face at the corner portions of the substrate G, for example, a solvent component supply nozzle having a discharge port capable of discharging a gas flow containing vapor or solvent vapor, or a solvent mist. FIG. 7 shows an example of supplying the solvent vapor. In FIG. 7, a numeral 7 denotes a solvent supply nozzle formed with a discharge port 71 at its lower end tip. The solvent supply nozzle 7 is further connected to a solvent vapor supply source 73 via a supply path 72. In this case, for example, the solvent supply nozzle 7 is located such that the discharge port 71 is positioned near the inner peripheral edge of the gas flow restraining ring 4, so as to supply the solvent vapor to the gas flow toward the space between the front face at the corner portions of the substrate G rotated about the vertical axis and the gas flow restraining ring 4, for example, during the coating of the resist and/or the spin drying thereafter. In such a configuration, the concentration of the solvent component contained in the gas flow passing above the corner portions can be adjusted more surely, and as a result, the effects similar to those in the above-described case can be obtained more surely.

Figure 8:
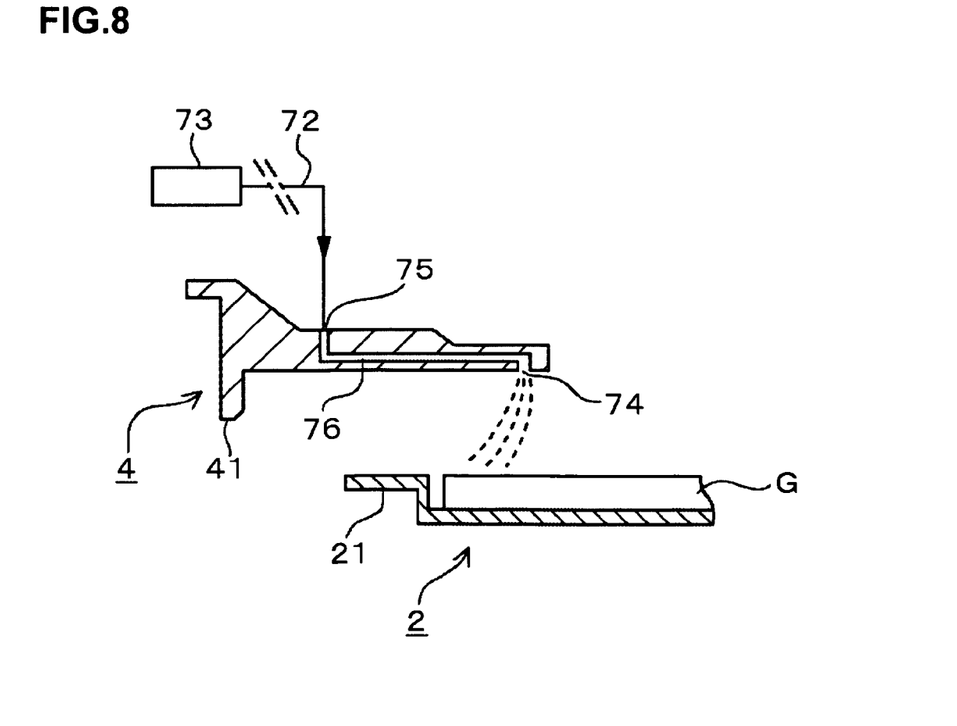
FIG. 8 is an explanatory view showing still another example of the gas flow restraining ring provided in the coating treatment apparatus in FIG. 1.

The solvent component supply unit is not limited to the above-described solvent supply nozzle 7, but may have a configuration in which, for example, a discharge port 74 for the solvent component, being the solvent component supply unit, is provided on the rear face side of the gas flow restraining ring 4 as shown in FIG. 8. The discharge port 74 communicates with a supply port 75 formed on the front face side, for example, via a flow passage 76 formed inside the gas flow restraining ring 4. Also in such a configuration, the effects similar to those in the above-described case can be obtained.

Further, the configuration in the present invention is not limited to one in which the height of the gas flow restraining ring 4 is adjusted based on the coating condition, but may be one in which the set value of the height of the gas flow restraining ring is set for each coating unit which is made, for example, by unitizing the above-described coating treatment apparatus. More specifically, for example, when a plurality of coating units are incorporated in the coating and developing apparatus, film thickness profiles of coating films may be different among the units even on the substrates G having the same coating condition, though the difference is little, because of, for example, the arrangement in which the coating units are placed or the like. In this case, the height of the gas flow restraining ring 4 is adjusted for each unit, whereby coating treatments uniform among the plurality of units can be expected. Further, when there is a difference in film thickness profile among units set such that the height of the gas flow restraining ring 4 is adjusted based on the coating condition, the film thickness profile may be finely adjusted among the units.

Figure 9:
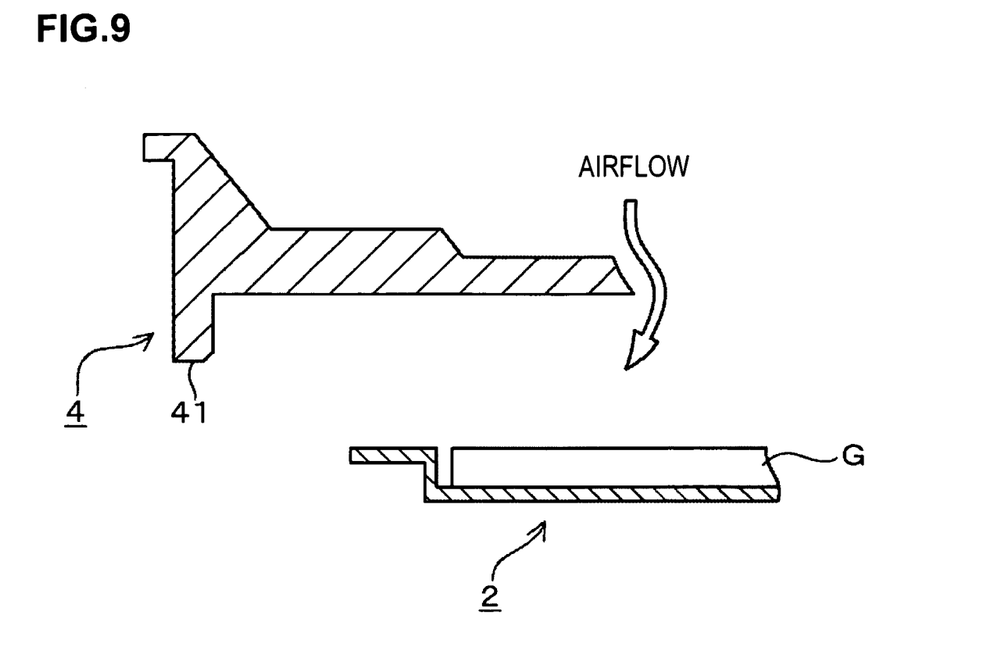
FIG. 9 is an explanatory view showing still another example of the gas flow restraining ring provided in the coating treatment apparatus in FIG. 1.
Figure 10:
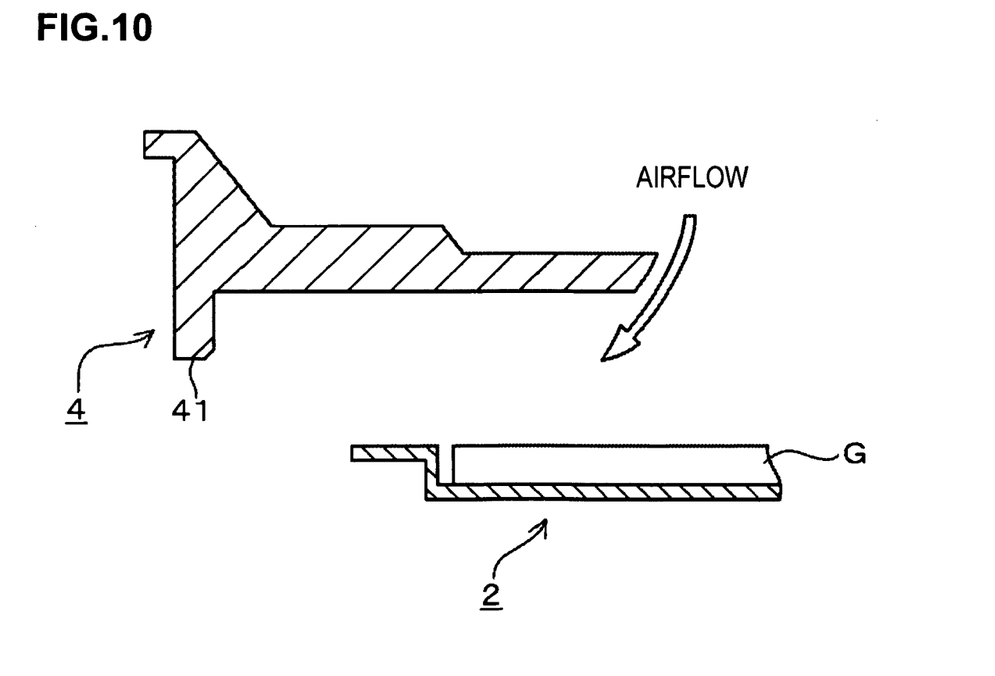
FIG. 10 is an explanatory view showing still another example of the gas flow restraining ring provided in the coating treatment apparatus in FIG. 1.

Further, the configuration of the inner peripheral face of the gas flow restraining ring 4 is not limited to a configuration in which it is formed into the vertical face, but the inner peripheral face may be formed into, for example, an inclined face inclined downward to the outside as shown in FIG. 9. In this case, the gas flow from above will once go to the center side of the substrate G due to the inclined face, and therefore, for example, when the coating treatment is performed with the region against which the gas flow hits set small, the region can be expected to be made small more surely. On the contrary, for example, when the coating treatment is performed with the region against which the gas flow hits set large, the inner peripheral face of the gas flow restraining ring 4 may be formed into an inclined face inclined upward to the outside as shown in FIG. 10.

In the present invention, the gas flow from above toward the front face of the substrate G may be downflow for preventing attachment of particles. Also in this case, the effects similar to those in the above-described case can be obtained.

Further, in the present invention, the coating solution is not limited to resist, but may be, for example, a coating solution for an interlayer insulating film. Further, the substrate G is not limited to the mask substrate, but may be a glass substrate for a liquid crystal display, and a semiconductor wafer.

Figure 11:
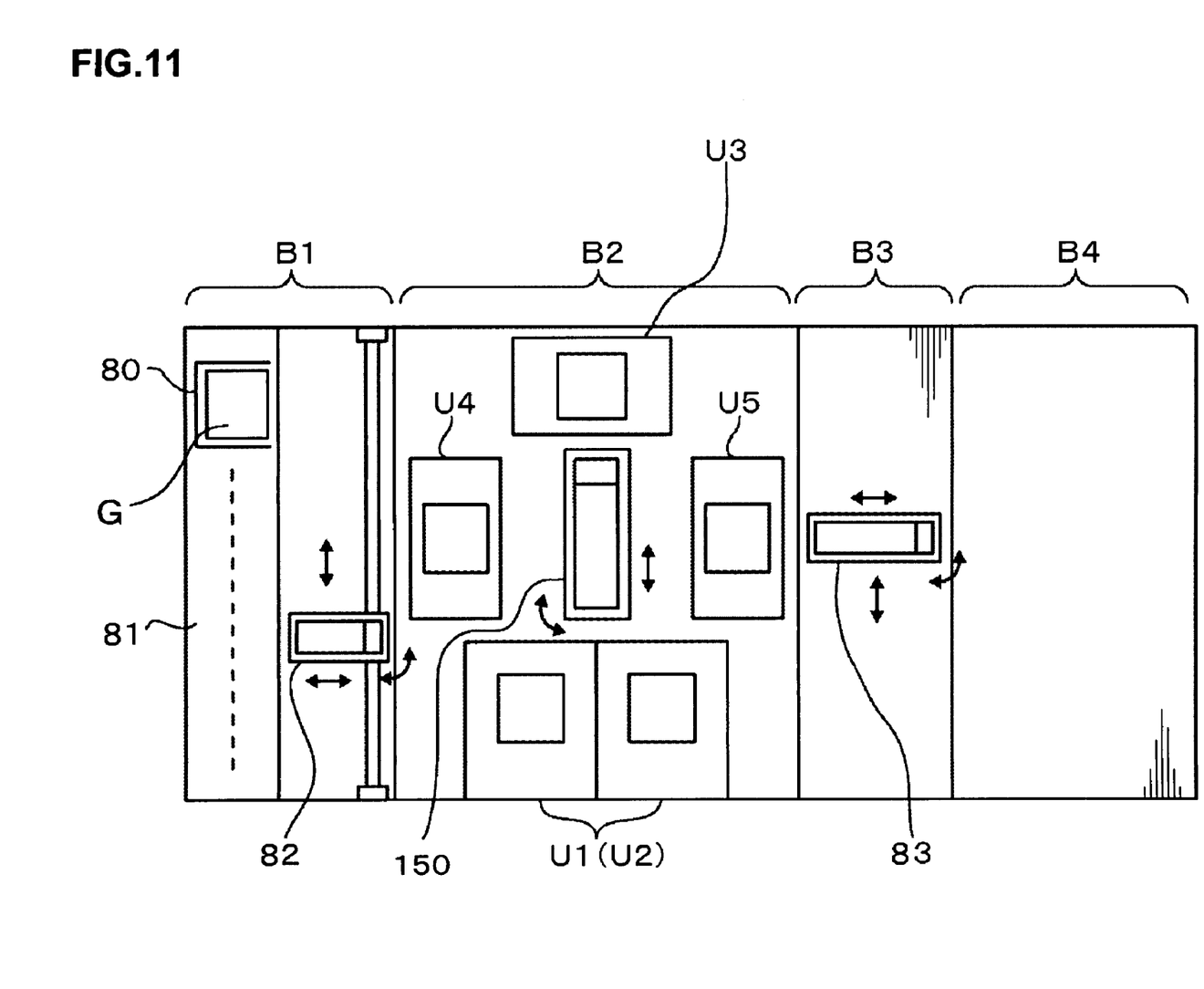
FIG. 11 is a plan view showing a coating and developing apparatus in which the coating treatment apparatus of the present invention is incorporated.
Figure 12:
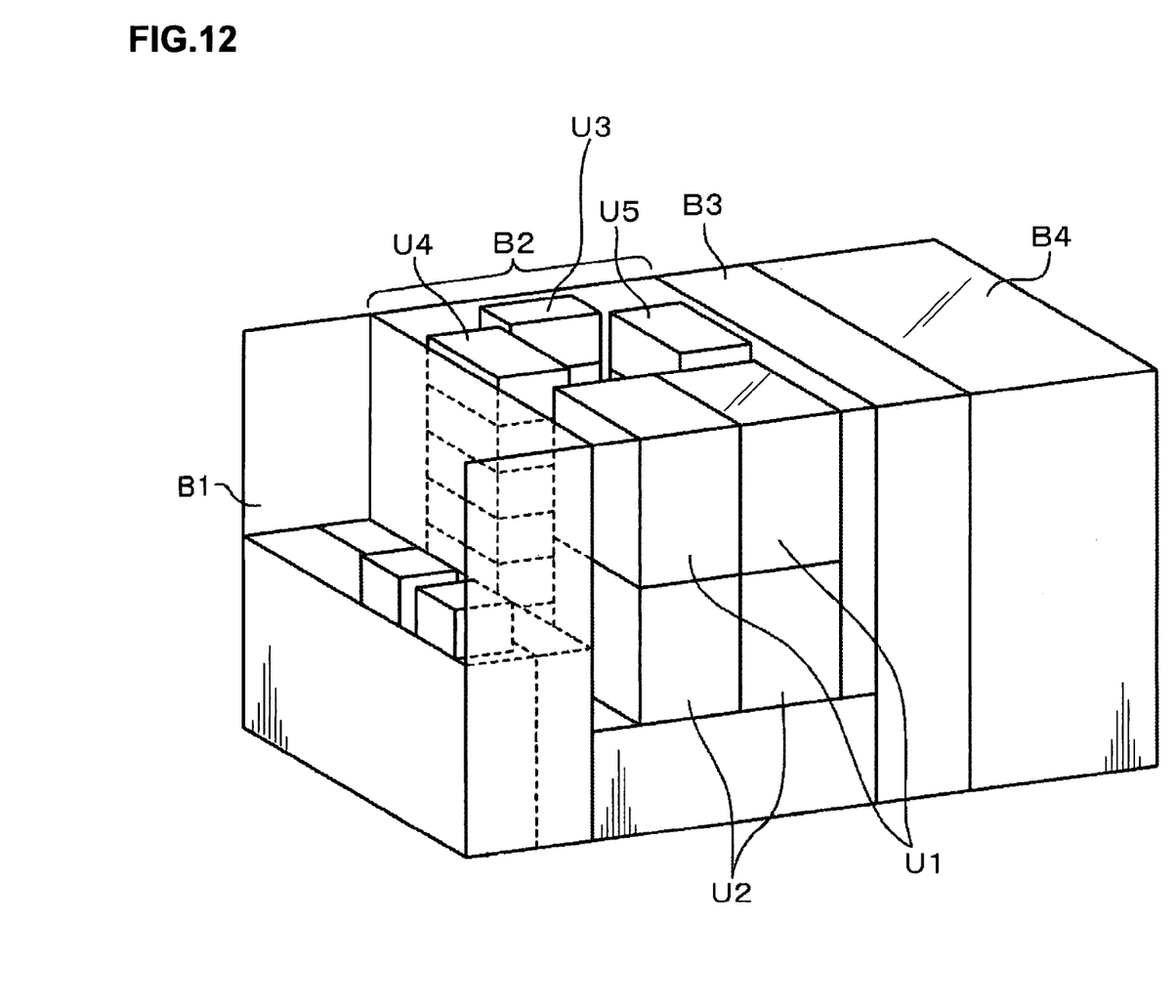
FIG. 12 is a perspective view of the coating and developing apparatus in FIG. 11.

Finally, an example of the coating and developing apparatus, in which the coating treatment apparatus of the present invention is incorporated as a coating unit U1, will be explained with reference to FIG. 11 and FIG. 12. In the drawings, a numeral B1 denotes a carrier block B1 including a carrier mounting section 81 for mounting thereon a carrier 80 in which a plurality of substrates G are housed and a delivery unit 82, and a processing block B2 is connected to the back side of the carrier block B1.

A main carrier unit, for example, the above-described carrier arm 150 is provided in the processing block B2, and to surround the carrier arm 150, the above-described coating unit U1 and a developing unit U2 for developing a substrate after exposure are provided on the right side looking from the carrier block B1, a cleaning unit U3 for cleaning the substrate is provided on the left side, and further shelf units U4 and U5 in which heating and cooling units for performing heating and cooling treatments on the substrate G and delivery units for delivering the substrate are multi-tiered are provided on the front side and back side.

Further, the carrier arm 150 is configured to freely rise and lower and move back and forth, and freely rotatable about the vertical axis, so that the substrate G can be delivered between the coating unit U1, the developing unit U2, the cleaning unit U3, and the shelf units U4 and U5. Furthermore, the processing block B2 is connected, via an interface block B3, with an exposure block B4 for performing exposure processing using a predetermined mask, for example, on the substrate on which the resist film has been formed, and a delivery unit 83 is provided in the interface block B3 so that the substrate G can be delivered between the delivery unit being one of the shelves in the shelf unit U5 and the exposure block B4.

To briefly describe the flow of the substrate G in the apparatus, when the carrier 80 in which the substrates G are housed is first carried into the carrier mounting section 81 from the outside, one substrate G is taken out of the carrier 80 by the delivery unit 82 and passed to the carrier arm 150 via the delivery unit being one of the shelves in the shelf unit U4, and carried in sequence into the cleaning unit U3, the heating unit, the cooling unit, the coating unit U1, in which, for example, a resist film is formed by the above-described method. Subsequently, the substrate G is subjected to pre-baking processing in the heating unit, and adjusted to a predetermined temperature in the cooling unit, and then carried via the delivery unit 83 into the exposure block B4 in which the substrate G is subjected to exposure. Thereafter, the substrate G is carried into the heating unit in which it is subjected to post-exposure baking processing at a predetermined temperature and then adjusted in temperature to a predetermined temperature in the cooling unit, and thereafter it is subjected to developing treatment in the developing unit U2. In this way, the substrate G is subjected to predetermined treatments and processing, and the substrate G on which, for example, a resist mask pattern has been formed on its front face is returned to the original carrier 80.

As has been described, for example, combination of the inside diameter and the height of the gas flow restraining ring enables finer gas flow control and improvement in in-plane uniformity of the film thickness. Furthermore, it is also possible to change the height of the gas flow restraining ring in accordance with, for example, the rotation speed of the substrate during the coating treatment, so that the gas flow control can be performed at a higher degree of freedom.

What is claimed is:

1. A coating treatment apparatus for supplying a coating solution containing a coating film forming component and a solvent to a front face of a square substrate and rotating the substrate about a vertical axis to spread the coating solution into a thin film state over the front face of the substrate, comprising:
    a substrate holding unit for horizontally holding the substrate;
    a rotating mechanism for rotating the substrate on said substrate holding unit about the vertical axis;
    a coating solution nozzle for supplying the coating solution to the front face of the substrate;
    a gas flow restraining ring provided facing the front face at corner portions of the substrate held on said substrate holding unit, for restraining a gas flow above the substrate;
    a raising and lowering mechanism for raising and lowering said gas flow restraining ring; and
    a solvent supply unit for supplying a solvent as a vapor or a mist to a gas flow formed above the front face of the substrate,
    wherein said solvent supply unit has a solvent flow passage provided in said gas flow restraining ring and a solvent supply port opening in a lower face of said gas flow restraining ring.

2. The coating treatment apparatus as set forth in claim 1, further comprising:
    a cup provided to surround said substrate holding unit and an exhaust path for exhausting an atmosphere in the cup,
    wherein said gas flow restraining ring is provided along an inner periphery of the cup.

3. The coating treatment apparatus as set forth in claim 1, further comprising:
    a control unit for storing data for changing the height of said gas flow restraining ring in accordance with a rotation speed of the substrate and further controlling based on the height of said gas flow restraining ring during a coating treatment of the substrate.

4. The coating treatment apparatus as set forth in claim 1, further comprising:
    a control unit for storing data in which the height of said gas flow restraining ring is associated with at least one kind of coating solution, a target film thickness of a coating film, or a target area of the front face of the substrate where an in-plane uniformity is attained at a predetermined value or more in terms of the film thickness, and controlling based on the height of said gas flow restraining ring.

5. The coating treatment apparatus as set forth in claim 1, further comprising:
    a supporting member raised and lowered by said raising and lowering mechanism,
    wherein said gas flow restraining ring is freely attachably and detachably provided on said supporting member, and
    wherein said gas flow restraining ring is replaceable with another gas flow restraining ring different in inside diameter.

6. The coating treatment apparatus as set forth in claim 1, further comprising:
    a control unit for controlling the height of the gas flow restraining ring during a coating treatment of the substrate.

* * * * *